(12) United States Patent
Benzel et al.

(10) Patent No.: US 7,354,786 B2
(45) Date of Patent: Apr. 8, 2008

(54) SENSOR ELEMENT WITH TRENCHED CAVITY

(75) Inventors: Hubert Benzel, Pliezhausen (DE);
Stefan Finkbeiner, Gomaringen (DE);
Matthias Illing, Kusterdingen (DE);
Frank Schaefer, Tuebingen (DE);
Simon Armbruster, Gomaringen (DE);
Gerhard Lammel, Tübingen (DE);
Christoph Schelling, Reutlingen (DE);
Joerg Brasas, Walddorfhaeslach (DE)

(73) Assignee: Robert Bosch GmbH, Stuttgart (DE)

( * ) Notice: Subject to any disclaimer, the term of this patent is extended or adjusted under 35 U.S.C. 154(b) by 302 days.

(21) Appl. No.: 11/223,592

(22) Filed: Sep. 8, 2005

(65) Prior Publication Data

US 2006/0057816 A1   Mar. 16, 2006

(30) Foreign Application Priority Data

Sep. 8, 2004   (DE) .................. 10 2004 043 356

(51) Int. Cl.
    *H01L 21/00*   (2006.01)
(52) U.S. Cl. .................. 438/50; 438/480; 438/424; 438/694; 438/68; 438/243; 438/274; 438/427; 438/51; 438/52; 438/53; 438/54; 257/506; 257/510
(58) Field of Classification Search ........... 438/480, 438/424, 694, 50–55, 68, 243, 274, 427; 257/506, 510
See application file for complete search history.

(56) References Cited

U.S. PATENT DOCUMENTS 6,051,866 A * 4/2000 Shaw et al. .............. 257/417

6,569,702 B2 * 5/2003 Cho et al. ................. 438/50
6,756,247 B1 * 6/2004 Davis et al. ............... 438/52

(Continued)

FOREIGN PATENT DOCUMENTS

DE    100 30 352    1/2002

(Continued)

*Primary Examiner*—Kiesha L. Rose
*Assistant Examiner*—Eric W Jones
(74) *Attorney, Agent, or Firm*—Kenyon & Kenyon LLP

(57) ABSTRACT

A micromechanical sensor element and a method for the production of a micromechanical sensor element that is suitable, for example in a micromechanical component, for detecting a physical quantity. Provision is made for the sensor element to include a substrate, an access hole and a buried cavity, at least one of the access holes and the cavity being produced in the substrate by a trench etching and/or, in particular, an isotropic etching process. The trench etching process includes different trenching (trench etching) steps which may be divided into a first phase and a second phase. Thus, in the first phase, at least one first trenching step is carried out in which, in a predeterminable first time period, material is etched out of the substrate and a depression is produced. In that trenching step, a typical concavity is produced in the wall of the depression. A passivation process is then carried out in that first phase, in which the concavity produced in the walls of the depression by the first trenching step is covered with a passivation material. The first trenching step and the first passivation process may be carried out repeatedly in alternating succession within the first phase, with the result that a typical corrugation is obtained on the walls of the depression so produced. In the second phase of the trench etching process, the cavity is produced through the at least one access hole produced by the depression, by carrying out a second trenching step of a predetermined second time period that is distinctly longer in comparison with the first time period.

11 Claims, 4 Drawing Sheets

U.S. PATENT DOCUMENTS

2004/0227207 A1* 11/2004 Barlocchi et al. ............ 257/510
2006/0017131 A9* 1/2006 Villa et al. .................. 257/506
2006/0292877 A1* 12/2006 Lake .......................... 438/694

FOREIGN PATENT DOCUMENTS

| | | |
|---|---|---|
| DE | 100 32 579 | 1/2002 |
| DE | 101 14 036 | 10/2002 |
| DE | 10358859 | 12/2003 |
| DE | 102004036035 | 7/2005 |
| EP | 1 043 770 | 10/2000 |
| WO | 02/02458 | 1/2002 |

* cited by examiner

SENSOR ELEMENT WITH TRENCHED CAVITY

FIELD OF THE INVENTION

The present invention relates to a method for the production of a micromechanical sensor element and to a micromechanical sensor element.

BACKGROUND INFORMATION

Components having micromechanical sensor elements are in many cases used, particularly in the automotive sector, for detecting various physical quantities (pressure, temperature, air mass, acceleration, revolution speed). Typically, measuring elements on membranes arranged above a cavity are often used for this. For the production of the membrane and the cavity, apart from so-called surface micromachining, in which stacks of layers made up of sacrificial layers and functional layers are deposited, patterned and selectively removed, so-called bulk micromachining is also known, in which structures are worked from solid material. More recent methods combine surface micromachining and bulk micromachining.

For example, International Published Patent Application No. 02/02458, or German Published Patent Application No. 100 32 579, describes a method in which regions of differing porosity are formed in a substrate to produce a hollow space beneath a membrane.

It is known from German Published Patent Application No. 100 30 352 to support a membrane above a cavity using stabilizing elements. Such stabilizing elements may be produced, for example, by a trench etching process as described in the non-prior-published German Patent Nos. 102004036035 and 10358859.

Another possibility for forming a hollow space in a substrate is shown in German Published Patent Application No. 101 14 036. In the method described in that document, first an opening is produced in the substrate, followed by temperature treatment of the substrate. By selection of the temperature and the duration of that annealing process, a hollow space is formed deep inside the substrate, with the opening being closed. By using a plurality of adjacent openings, a membrane with a hollow space beneath it may be produced by that method.

European Published Patent Application No. 1 043 770 describes a method for the production of a cavity, in which first at least one trench is produced in a substrate by a first etching step. After passivation of the walls of the trench, the cavity is formed in the course of a second anisotropic etching step. Enlargement of the cavity may be carried out in a third etching step, which is also anisotropic, by removing the walls between a plurality of adjacent trenches.

SUMMARY OF THE INVENTION

The present invention describes a micromechanical sensor element and a method for the production of a micromechanical sensor element that is suitable, for example in a micromechanical component, for detecting a physical quantity. Provision is made for the sensor element to include a substrate, at least one access hole and a buried cavity, at least one of the access holes and the cavity being produced in the substrate by a trench etching and/or isotropic etching process. The trench etching process includes different trenching steps which may be divided into a first phase and a second phase. Thus, in the first phase, at least one first trenching step is carried out in which, in a predeterminable first time period, material is etched out of the substrate and a depression is produced. In that trenching step, a typical concavity is produced in the wall of the depression. A passivation process is then carried out in that first phase, in which the concavity produced in the walls of the depression by the first trenching step is covered with a passivation material. The first trenching step and the first passivation process may be carried out repeatedly in alternating succession within the first phase, with the result that a typical corrugation is obtained on the walls of the depression so produced. The essence of the present invention resides in the fact that, in the second phase of the trench etching process, the cavity is produced through the at least one access hole produced by the depression, by carrying out a second trenching step of a predetermined second time period that is distinctly longer in comparison with the first time period.

The advantage of such a method of producing a cavity lies in the fact that no additional second etching process, for example by a wet-chemical etching process, has to be performed. It is accordingly possible to dispense with additional expenditure on the method resulting from changing the processing materials. By selection of the repetitions of the first phase of the trench etching process it is possible to select a wide range of thicknesses of the webs which remain between the depressions of the substrate and to which a further layer may be applied in a further step of the method. Similarly, the height of the cavity may be set by selection of the second time period. Furthermore, it is possible for the cavity to be produced using established procedures (trench etching).

In one embodiment of the present invention, it is provided that the steps of the method in the first phase, formed by the first trenching step and the passivation process, are performed alternately at least twice before the second phase formed by the second trenching step is commenced. Furthermore, it is provided that the second trenching step dissolves material out of the substrate for longer by a multiple than the first trenching step. A further passivation layer may optionally be applied to the walls of the depression, or rather the access hole, and/or to the walls of the cavity.

In a development of the present invention, it may be provided that, after production of the cavity in the substrate, a layer is applied to the substrate to form a membrane. In that case, in a particular embodiment it may be provided that that layer is applied in the form of a monocrystalline layer, for example in an epitaxial process. That layer may be used, in addition, to seal the at least one access hole. Optionally, the walls of the depression, access hole and/or cavity may be freed of the passivation layer of the trenching process before the actual deposition of the layer.

Advantageously, a semiconductor material, such as, for example, silicon, is used as the substrate material. Owing to the use of a semiconductor material, it is possible to use customary procedures of micromechanical machining and patterning to produce the sensor element.

To carry out the trench etching process, in a further step of the method an etching mask is applied to the substrate. It may advantageously be provided here that the etching mask determines the subsequent distribution of the access holes on the surface of the substrate by holes in the etching mask. In a particular embodiment, the distribution of the holes in the etching mask may be geometric and/or symmetrical, with random distributions also being possible. With regard to the distribution of the holes, and thus to the production of the access holes, it must be borne in mind, however, that the under-etching which occurs during the isotropic etching process in the second phase is intended to cause the resulting recesses beneath the holes/access holes to grow together to form a cavity. Only in that manner is it possible to produce a coherent buried cavity. For that reason, the second time period must be dependent upon the average spacing of the holes in the etching mask, or rather the distribution of the access holes.

In a particular embodiment of the present invention, after production of the cavity, the at least one access hole is sealed from the front side of the substrate. Then, in a further step of the method, an access hole to the cavity is made from the rear side of the substrate. In that manner, it is possible to produce, for example, a differential pressure sensor.

In a development of the present invention, it is possible for a plurality of buried grid levels to be produced by repeating the trenching process formed by the first and the second phase. That repetition may take place several times.

Advantageously, the depression produced by the trench etching process has a high aspect ratio. Furthermore, before application of the preferably monocrystalline layer, an oxide layer may be applied to the walls of the cavity in order to prevent growth of the layer material into the cavity.

In general, provision is to be made for the sensor element according to the present invention to be advantageously used for detecting a pressure variable, a temperature variable, an air mass, an acceleration and/or a revolution speed. For that purpose it may possibly be necessary to pattern the membrane produced, for example, by the preferably monocrystalline layer.

There is also the possibility of producing (buried) channels in the semiconductor substrate by the method according to the present invention. For that purpose, it is possible, for example, to produce cavities that are sealed or covered with a suitable layer. Through-holes extending through the layer and possibly also through the substrate above the cavity may then be produced at different ends of the cavity.

DETAILED DESCRIPTION

In the case of the exemplary embodiment considered, the method according to the present invention will be explained with reference to the production of a sensor element having a membrane and a cavity, which sensor element is preferably usable in a pressure sensor. In addition, the method described hereinafter is also to be usable, however, for the production of sensor elements of air mass sensors, temperature sensors, acceleration sensors and/or revolution speed sensors. Furthermore, the production of channels is also possible, for example by producing a buried cavity having two through-holes at different locations of the cavity.

Figure 1A:
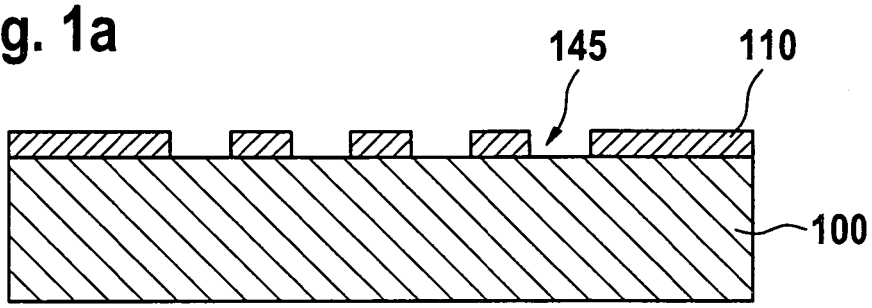
FIGS. 1a to d show illustrations of a schematic process sequence for the production of a cavity according to the present invention.
Figure 1B:
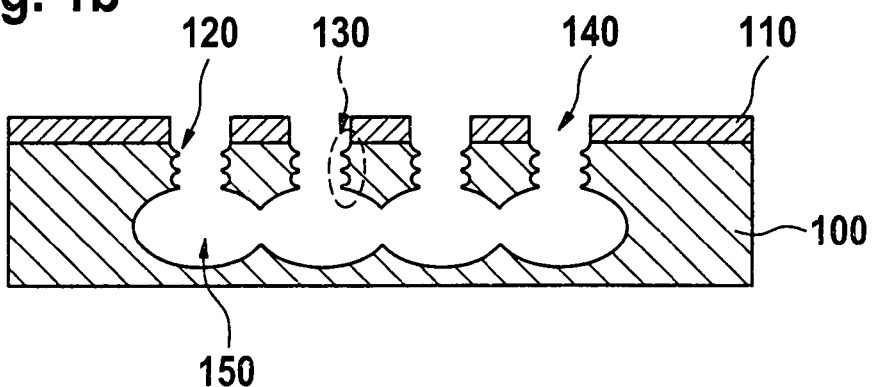
Figure 1C:
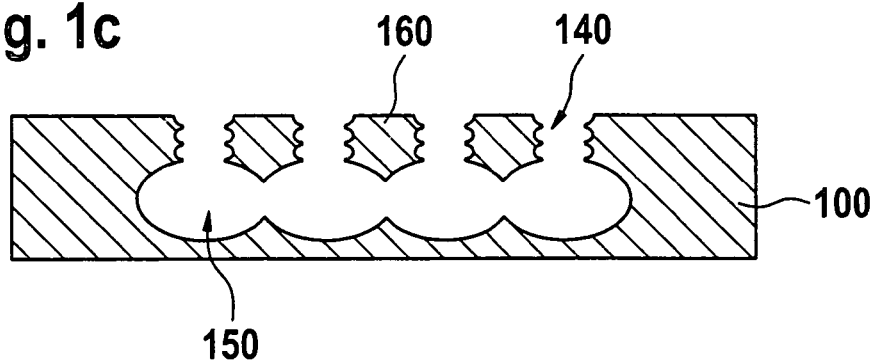
Figure 1D:
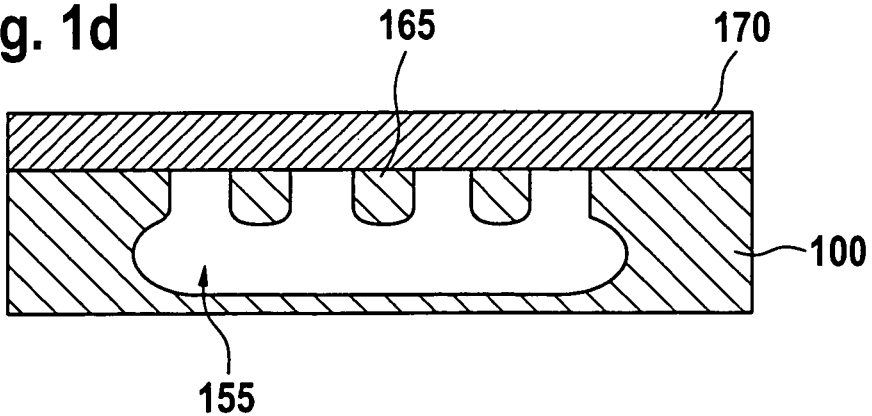

First of all, a suitable (etching) mask 110, e.g. a $SiO_2$ layer, is provided on a substrate 100, for example made of a semiconductor material, such as silicon, and patterned for the subsequent trench etching process. During patterning of mask 110, holes 145 are produced, for example at regular intervals, with different patterns being possible, for example rectangular, diagonal, hexagonal, annular or strip-shaped patterns. Furthermore, not only is the arrangement of the holes variable but also the shape of the individual holes. For example, the holes may be round (see inter alia FIG. 3a) or square (see FIG. 4b). In the next step of the method, which is shown in FIG. 1b, an anisotropic etching process, trenching, is carried out (the trenching as a whole, i.e. the etching process, is anistropically directed; the individual $SF_6$ cycle is isotropic). First, a cycle alternation between etching (e.g. with $SF_6$) and passivation (e.g. with $C_4F_8$) is selected, which is typical for trenching. This produces the customary trench or access holes 140 having a high aspect ratio and the typical, corrugated side walls 130. In order to enable material to be removed deep inside access holes 140 while the lateral dimension remains constant, after each trenching step a suitable passivation layer 120 is applied to side walls 130 over the newly formed corrugation. Finally, a distinctly longer trench etching step is carried out, during which that isotropic (dry) etching process leads to the formation of a recess. During that longer trench etching step, the recesses of a plurality of adjacent access holes 140 beneath a grid 160, which until then have been isolated from one another, are able to join together to form a cavity 150. In a further step of the method, etching mask 110 and possibly also trench passivation layer composed of $[C_4H_8]_n$ may be removed (see FIG. 1c). In a final step of the method, application of a layer 170 takes place, which seals access holes 140 and/or produces a membrane over cavity 155 (see FIG. 1d). In a particular exemplary embodiment, it may be provided here that access holes 140 are first closed or overgrown by silicon using an epitaxial process and then, in the same step, that a monocrystalline Si membrane is formed over the entire surface area. The thickness of the epitaxial layer defines the thickness of the membrane in this case. If (semiconductor) substrate 100 is made of silicon, owing to the high process temperature (typically above 1000° C.) during the hydrogen pre-bake (cleaning of the surface, e.g. to remove oxide and/or organics before the actual growth procedure) and the epitaxy, migration of Si atoms to free surfaces occurs. As a result, corrugated structures 130 are rounded off and rounded grid webs 165 are produced, as is to be seen in FIG. 1d.

Figure 2A:
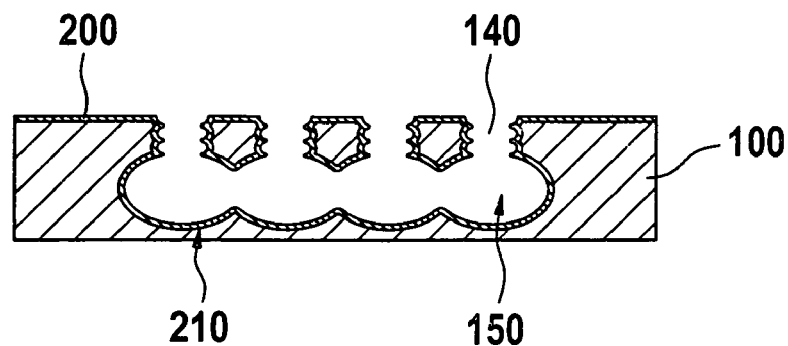
FIGS. 2a and b describe a particular coating intended to prevent the growth of material into the cavity.
Figure 2B:
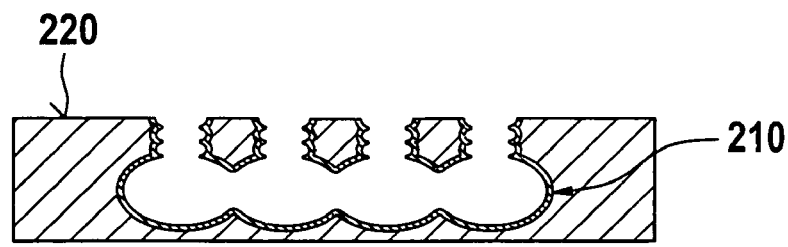

To minimize the possible growth of Si into access openings 140 and buried cavity 150 during the epitaxy process, the walls thereof may be "lined" with a suitable layer 210, for example an oxide, in a separate step of the method, preferably after the complete etching process. Such coating is typically carried out by thermal oxidation, as illustrated in FIG. 2a. Before the silicon may then be grown epitaxially, however, protective layer 200 which was formed on the surface of substrate 100 has to be selectively removed, e.g. by physical etching (see FIG. 2b). It is then possible for the silicon to grow in monocrystalline form on surface 220.

Figure 3A:
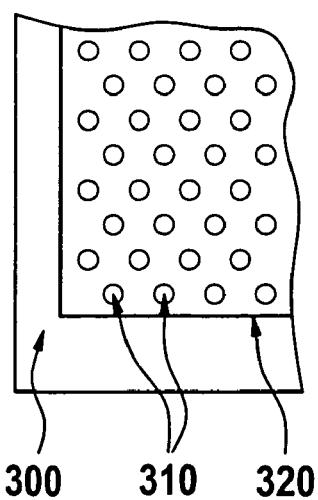
FIGS. 3a to c show further illustrations in plan view of the process sequence.
Figure 3B:
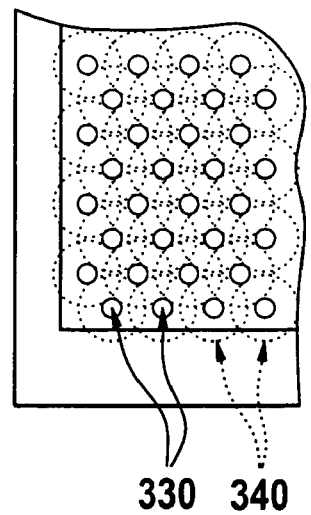
Figure 3C:
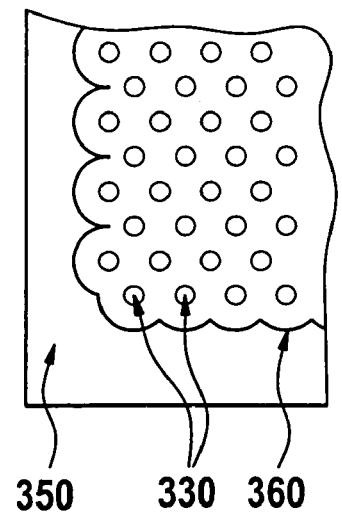

A schematic illustration of the course of the method according to the present invention in plan view is shown in FIGS. 3a to c. As already explained, first a patterned etching mask 300 which has openings 310 in future membrane region 320 is applied to a substrate. Via those openings 310 it is possible to produce first of all access openings 330 and, in a prolonged trench etching step, recesses 340 below access openings 330. After etching mask 300 has been dissolved away, it is possible to see from the plan view substrate 350 with access holes 330 which lead to buried cavity 360.

Figure 4A:
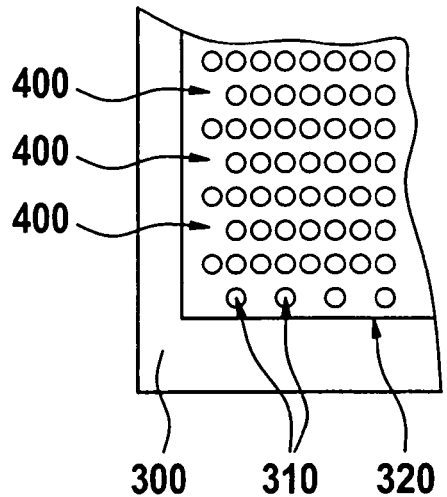
FIGS. 4a and b show particular embodiments of the hole geometry by which the etching process is given access to the substrate.
Figure 4B:
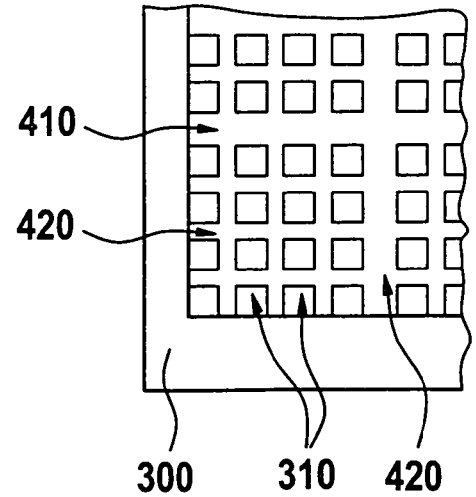

Improved attachment of the edge of the membrane to the substrate may be achieved by local optimization of the grid geometry at the edge of the membrane, e.g. by:

omitting grid holes at the edge of the membrane, e.g. every other hole 400 in the first row (shown in FIG. 4a for a rectangular grid)

smaller holes at the edge of the membrane, e.g. in the first row wider grid webs at the edge of the membrane The corresponding geometries may be taken into consideration in associated etching mask 110 or 300.

Furthermore, in addition to simple grid structures, mixed forms of various geometries are also possible. A rectangular grid 420 with a second (similarly rectangular) superordinate grid 410 is shown as an example in FIG. 4b. The corresponding geometries may similarly be taken into consideration in corresponding etching mask 110/300.

Figure 5A:
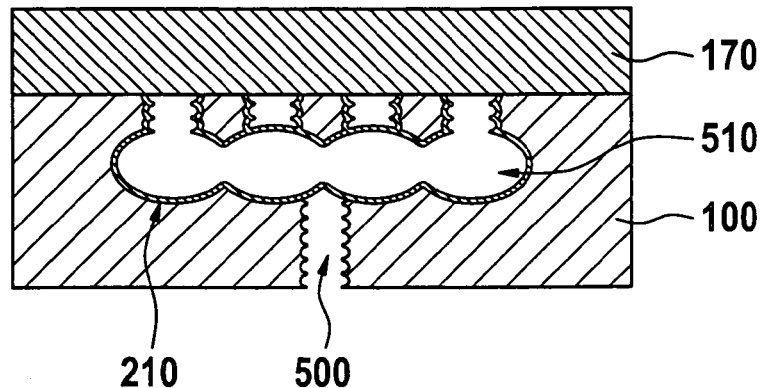
FIGS. 5a and b show an embodiment of the present invention for the production of a differential pressure sensor.
Figure 5B:
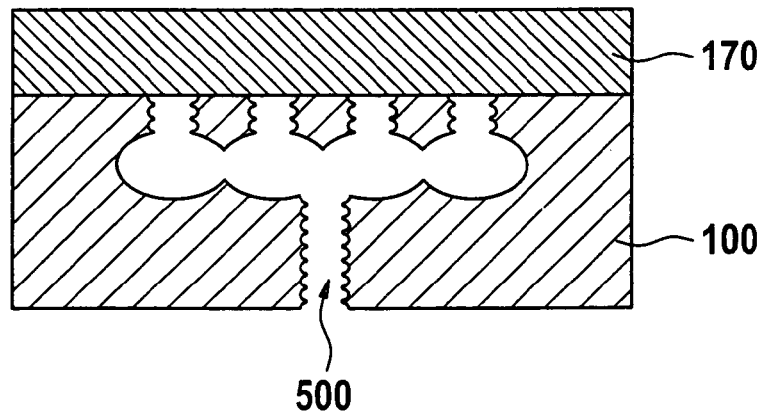

The sensor element according to the present invention having the membrane and cavity 155 may be used, for example, for an absolute pressure sensor, it being possible to provide that piezo-resistive resistors are applied to the membrane. For that purpose, a circuit may be integrated beside or also on top of the membrane. For the production of a differential pressure sensor, a separate connecting opening to buried cavity 510 is necessary. Thus, it is possible by a further etching process, for example a trench etching process, to provide a corresponding access 500 from the rear side of substrate 100, the trench etching process automatically stopping at oxide 210 which is already present on the underside of the cavity (see FIG. 5a). As shown in FIG. 5b, it is possible using a final etching step, e.g. in HF vapor, to remove oxide layer 210 selectively as far as the substrate material, e.g. silicon, thereby ultimately opening the access.

For other micromechanical applications it is also possible to pattern the membrane in order, for example, to produce oscillator structures for acceleration sensors. As a further variant of the method described, the final, isotropic etching step for joining individual recesses 150 together may also be carried out in etching mask 110 with alternative isotropic etching media, e.g. with gases such as $XeF_2$ or $ClF_3$, or wet-chemically, e.g. with a mixture of $HNO_3$ and HF.

Figure 6A:
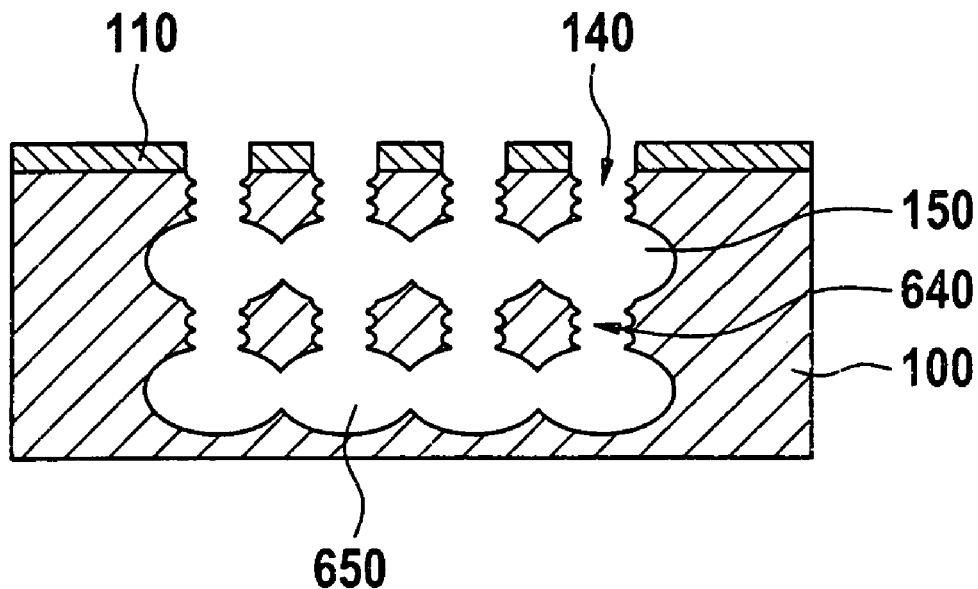
FIGS. 6a and b show the possibility of producing a second level beneath a membrane using the method according to the present invention.
Figure 6B:
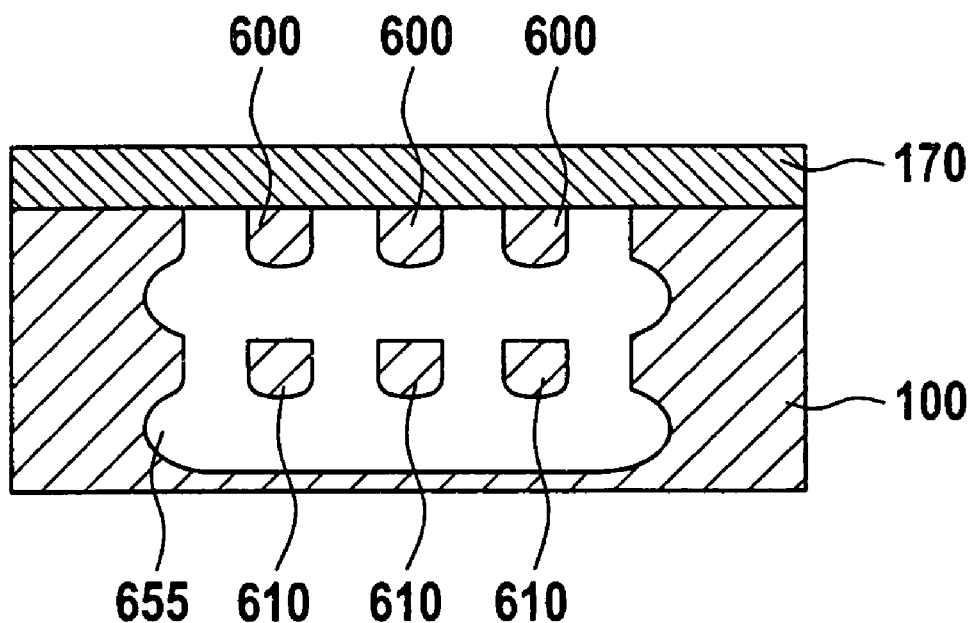

A further exemplary embodiment, with which it is possible to produce a buried grid 610 by using the method according to the present invention iteratively, is shown in FIGS. 6a and 6b. In this instance, after production of access holes 140 and cavity 150, the trench etching process which has formed access holes 140 is continued. The result of continuing the trench etching process is the formation of deeper through-holes 640 beneath access holes 140. If the last trench etching process is again carried out for a longer period than in the formation of the through-holes, recesses that grow together to form a cavity 650 situated at a lower depth will also be formed. Further buried cavities are possible in principle using that iterative procedure. Altogether, a coherent region 655 with a plurality of individual cavities 150 and 650 may be produced in that manner.

In general, the second time period, which produces the recesses and also the subsequent cavity, may depend upon the distribution and the average spacing of access holes 140 on the surface. A corresponding dependent relationship may obviously also be found for holes 145 in the etching mask which determine the position of the access holes.

In a further embodiment, the trenching process illustrated (FIGS. 1a to 1d) may also be used for the production of interdigital structures, e.g. for an acceleration sensor. The otherwise customary production process of sacrificial oxide deposition, epipoly deposition, trenching and HF vapor etching is thus replaced by a single trenching operation.

What is claimed is:

1. A method for producing a micromechanical sensor element including at least one substrate, at least one access hole, and at least one buried cavity, comprising:

producing the at least one access hole and the at least one cavity in the at least one substrate by a first trench etching, the first trench etching including different trench etching steps and a first phase and a second phase, wherein:

carried out alternately in the first phase are the first trench etching for a predetermined first time period and a first passivation process;

producing the at least one cavity in the second phase through the at least one access hole, performing a second trench etching in the second phase for a predetermined second time period, wherein the second time period is longer than the first time period.

2. The method as recited in claim 1, wherein the first phase is performed at least twice before the second phase is carried out.

3. The method as recited in claim 1, wherein the second trench etching is at least one of:

performed by an isotropic gas-phase etching, and longer by a multiple than the first trench etching.

4. The method as recited in claim 1, further comprising:

after production of the at least one cavity, applying a monocrystalline layer to the at least one substrate, wherein at least one of:

the monocrystalline layer is applied by an epitaxial process, the monocrystalline layer seals the at least one access hole, a passivation layer is applied to at least one of walls of the at least one access hole and the at least one cavity before the monocrystalline layer, and the walls of the at least one access hole are freed of the passivation layer beforehand.

5. The method as recited in claim 1, wherein the at least one substrate includes a semiconductor material.

6. The method as recited in claim 5, wherein the semiconductor material includes silicon.

7. The method as recited in claim 1, further comprising:

in order to carry out at least one of the first trench etching and the second trench etching, applying an etching mask to the at least one substrate, wherein:

the at least one access hole includes plural access holes, and the etching mask determines a distribution of the access holes on a surface of the at least one substrate by holes in the etching mask.

8. The method as recited in claim 7, further comprising:

arranging the access holes on the surface of the at least one substrate, wherein:

the second time period is predeterminable in dependence upon at least one of the distribution of the access holes on the surface of the at least one substrate and a distribution of the holes in the etching mask.

9. The method as recited in claim 1, further comprising:
sealing the at least one access hole from a front side of the at least one substrate after production of the at least one cavity; and
forming an access opening to the at least one cavity from a rear side of the at least one substrate.

10. The method as recited in claim 1, further comprising:
after the second phase, a first phase and a second phase of a further trench etching is carried out again.

11. The method as recited in claim 1, wherein the first trench etching includes an isotropic etching process.

* * * * *